United States Patent

Schwenk et al.

[11] Patent Number: 5,585,599
[45] Date of Patent: Dec. 17, 1996

[54] HOUSING FOR ELECTRONIC DEVICES

[76] Inventors: Hans-Martin Schwenk, Wiesenweg 9a; Henning Wick, Buchelstrasse 35, both of D-75334 Straubenhardt, Germany

[21] Appl. No.: 220,543

[22] Filed: Mar. 31, 1994

[30] Foreign Application Priority Data

Apr. 6, 1993 [DE] Germany ............... 43 11 246.3

[51] Int. Cl.[6] ..................................... H05K 9/00
[52] U.S. Cl. ..................... 174/35 R; 49/490.1; 49/489.1
[58] Field of Search ............... 174/35 R, 35 GC, 174/35 C; 361/638, 649, 769, 787, 816, 818; 49/483.1, 489.1, 490.1, 496.1; 24/293, 294, 295; 439/609; 312/296, 297

[56] References Cited

U.S. PATENT DOCUMENTS

| | | | |
|---|---|---|---|
| 3,247,312 | 4/1966 | Alessi | 174/35 GC |
| 4,523,069 | 6/1985 | Staats | 174/35 GC X |
| 4,643,319 | 2/1987 | Debus et al. | 211/189 |
| 4,677,251 | 6/1987 | Merewether | 174/35 MS |
| 4,760,496 | 7/1988 | Koch | 174/35 R X |
| 5,020,866 | 6/1991 | McIlwraith | 312/265.4 |
| 5,207,023 | 5/1993 | Forsberg et al. | 174/35 MS X |
| 5,223,670 | 6/1993 | Hogan et al. | 174/35 MS |
| 5,233,507 | 8/1993 | Günther et al. | |
| 5,435,641 | 7/1995 | Dumon Dupuis et al. | 312/223.1 |

FOREIGN PATENT DOCUMENTS

| | | | |
|---|---|---|---|
| 0516986 | 12/1992 | European Pat. Off. | |
| 2601277 | 7/1976 | Germany | 174/35 GC |
| 4110800C1 | 7/1992 | Germany | |
| 4127468C1 | 10/1992 | Germany | |

Primary Examiner—Bot L. Ledynh
Attorney, Agent, or Firm—Spencer & Frank

[57] ABSTRACT

A housing for electronic devices. The housing has a base having profiled metal bars that have at least one longitudinal chamber, at least one metal covering part that is secured to the base and has an inwardly-chambered strip, and at least one contact spring that has a U-shaped cross-section and is disposed between the metal bars and the covering part. A side wall of the longitudinal chamber is formed by a clamping rib for inserting the contact spring, the chamber having a longitudinal slit which adjoins the clamping rib, and the edge strip of the covering is parallel to the outer side of the clamping rib.

10 Claims, 3 Drawing Sheets

HOUSING FOR ELECTRONIC DEVICES

CROSS-REFERENCE TO RELATED APPLICATION

This application claims the priority of Patent Application Serial No. P 4,311,246.3, filed Apr. 6,1993, in the Federal Republic of Germany, the subject matter of which is incorporated herein by reference.

BACKGROUND OF THE INVENTION

The invention relates to a housing for electronic devices, having a base that comprises profiled metal bars that have at least one longitudinal chamber, having at least one metal covering part that is secured to the base and has an inwardly-chamfered edge strip, and having at least one contact spring that has a U-shaped cross-section between the metal bars and the covering part.

One particular application of the invention is in housings as well as device cabinets for industrial electronics whose componentry is sensitive to high-frequency interfering radiation and requires extensive shielding.

To serve as an HF shield, the base and covering parts must be electrically well-connected everywhere. The measures necessary for assuring this require large amounts of resources and are expensive. They involve the creation of contact zones located opposite one another and between which contact springs or spring strips are inserted that produce the desired electrical contact between the edges of the covering parts and the metal bars of the base. The metal bars of the housing, which serve as supporting and connecting components, are extruded hollow profiles whose particularly shaped cross-section, for reasons of stability and as a weight- and material-saving measure, has one or a plurality of channel-like, longitudinal chambers (German Patent DE-PS 4,127,468) on the inside that extend in the longitudinal direction. Before a surface protector, that is, a lacquer, is applied by means of normal lacquer spraying, electrostatic powder coating or also by means of wet or dry spray application, the required contact zones must remain free from lacquer. To achieve this, up to now adhesive strips provided on one side with pressure adhesive have been applied to the metal bars and must be removed after lacquering. Because this procedure is only performed in manual labor, it is associated with considerable costs, and a particular disadvantage of this procedure is that small and barely noticeable traces of the glue remain on the contact zones, preventing the production of an electrical contact at these locations and thus interrupting the shield.

Contact springs are known (German Patent 4,110,800) that have a U-cross-section for producing a seal against high frequencies of the longitudinal gaps between the front plates of components of electronic devices that can be inserted into HF-proof housings. These contact springs are inserted into longitudinal ribs that freely project laterally from the back side of the front plates; of course, a prerequisite is that the metal ribs remain bare.

SUMMARY OF THE INVENTION

It is the object of the invention to design the profile of the metal bars of the base of an HF-proof housing for electronic devices such that their surfaces that serve in electrical contacting with the covering parts remain free from lacquer during lacquering or coating.

The point of departure for attaining the object is a housing having a base that comprises profiled metal bars that have at least one longitudinal chamber, having at least one metal covering part connected to the base and that has an inwardly-chamfered edge strip, and having at least one contact spring that has a U-cross-section and is disposed between the metal bars and the covering part. The object is attained in that a side wall of the longitudinal chamber is formed by a clamping rib for attaching the contact spring, that a longitudinal slit of the longitudinal chamber adjoins the clamping rib, and that the edge strip of the covering part is parallel to the outer side of the clamping rib.

The concept of the invention is to dispose the contact zones necessary for shielding on the metal bars, inside the bar profiles, in such a manner that, during normal spray lacquering they cannot be reached by the lacquer, or that, during electrostatic coating, they are located in a Faraday cage formed by the profile such that no lacquer or powder deposit can take place.

It has been seen that, in all lacquering processes considered, practically no lacquer can enter the inside of the longitudinal chamber through the proposed narrow longitudinal slit of the chamber of the metal bars, which slit is disposed directly adjacent to the clamping rib. It has also been seen that the inside of the clamping rib remains bare, that is, free from lacquer, and is available for producing contact with the inserted contact spring.

In accordance with a further feature of the invention, one contact region of the inserted contact spring, namely its inside U-leg, rests in a contact-producing manner against the bare and thus electrically-conductive contact zone on the inside of the clamping rib. The outer U-leg of the contact spring, on the other hand, produces the electrical contact with the outer side of the edge strips of the attached covering part. This outer side is maintained in a conductive manner in a different way, and is located opposite the outer side of the clamping rib at a slight distance.

The contact region of the contact spring can have a barb whose point is oriented toward the free longitudinal side of the clamping rib. The point of the barb, which pierces the metal surface of the inside of the clamping rib after insertion of the contact spring, can penetrate, for example, interfering oxide layers, improving the production of electrical contact.

In an advantageous manner, the clamping rib has a longitudinally-extending holding groove on its outer side, into which a resilient tab of the contact spring extends. These two cooperative measures secure the inserted contact spring against undesired pulling, particularly during operation of the hinged doors of the housing.

In an advantageous manner, the contact spring has a spring tongue that rests against the outwardly-pointing side of the edge strip of the covering part. This spring tongue assures reliable contact production with the edge strip, even after the relevant covering part has been removed multiple times.

Inserting the contact spring over the length of the contact regions, which is predetermined by the housing dimensions, is greatly facilitated when the spring is composed of a plurality of connected spring elements, each of which has a barb, a tab and a spring tongue.

In the simplest case, the longitudinal chamber of the metal bar that has the longitudinal slit will have an essentially rectangular cross-section, because this permits the space-saving arrangement of two such longitudinal chambers in the same metal bar.

Preferably, the longitudinal slit is located in the region of a longitudinal edge of the longitudinal chamber. This geometry enables the longitudinal slit to be kept very narrow without hampering the insertion of the contact spring.

In accordance with a further feature of the invention, a longitudinal rib having an L-shaped cross-section and whose long L-leg is parallel to the clamping rib can be formed on the metal bars. Together with the clamping rib, this longitudinal rib forms a deep groove that is advantageous for receiving the edge strip of the covering part.

It is understood that the metal bars are sections of the same aluminum extruded profile.

BRIEF DESCRIPTION OF THE DRAWINGS

The invention is described in detail below by way of an embodiment with reference to the attached drawings, wherein.

DETAILED DESCRIPTION OF THE PREFERRED EMBODIMENT

Figure 1:
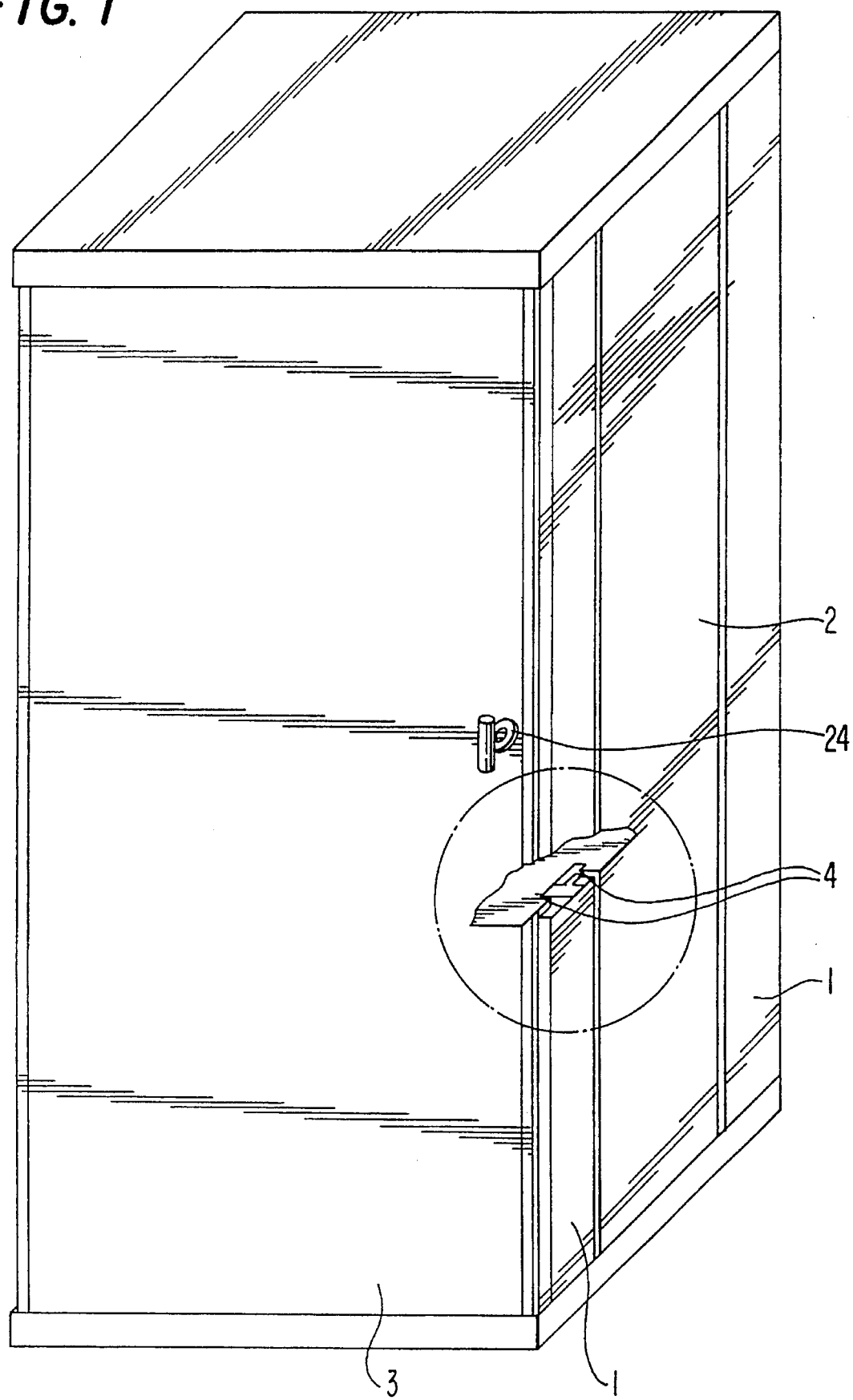
FIG. 1 shows a housing for electronic devices in a somewhat simplified, perspective representation, with a portion of an edge region in section and circled for emphasis.

FIG. 1 shows a device cabinet that receives electronic push-in devices (not shown) in the closed state of the housing. This housing comprises a parallelepiped base as a supporting structure; the base comprises four vertical, profiled metal bars 1. Covering parts 2 of sheet steel, which form the back wall, side pieces, roof and bottom of the housing, are securely mounted on this base. On both the front and rear sides, the covering part is a hinged door 3 likewise made of sheet steel and attached to swing. Contact springs 4 are provided everywhere between metal bars 1 and the covering parts 2 (hinged doors 3) for sealing against high frequencies.

Figure 2:
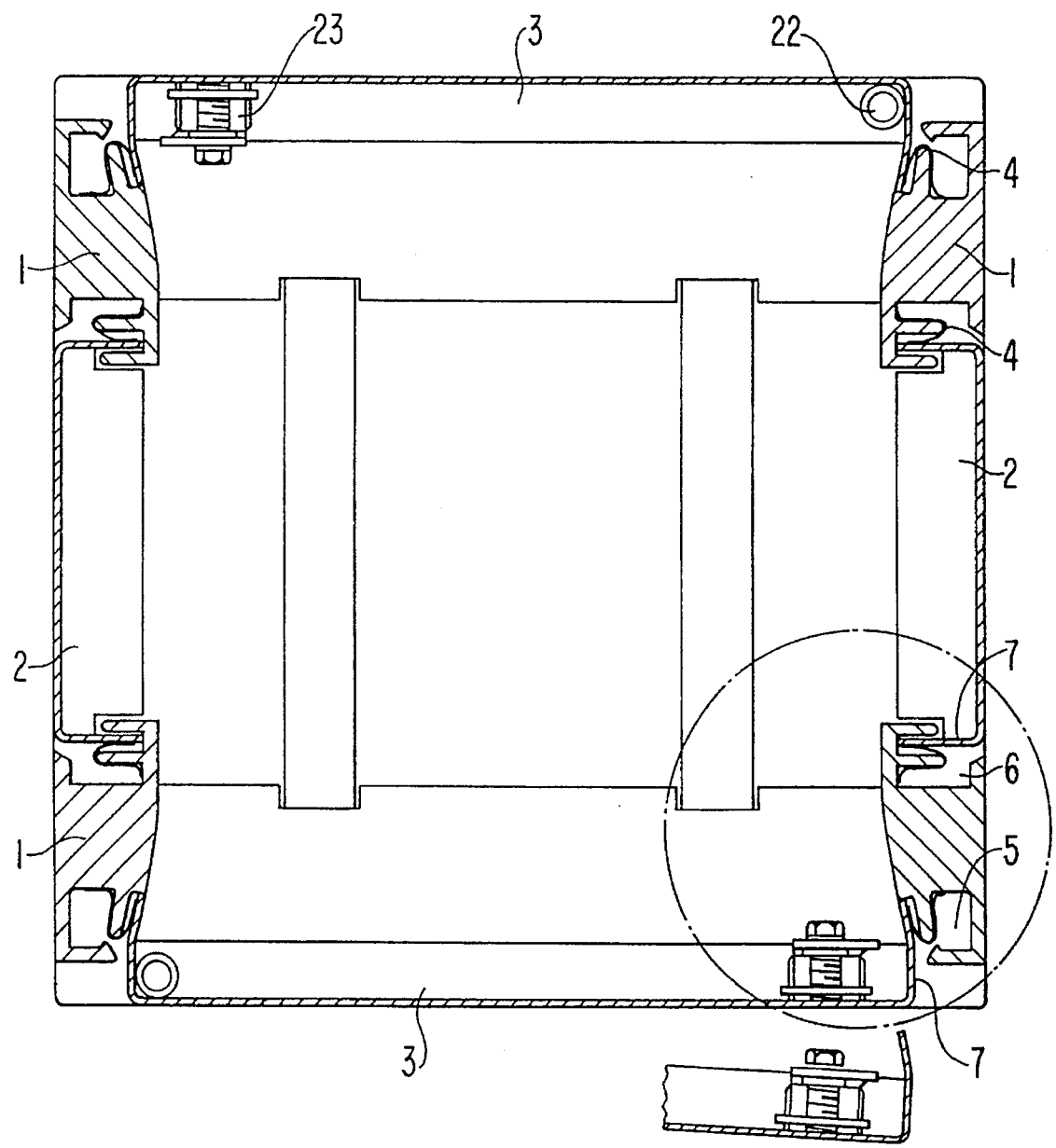
FIG. 2 shows a representation on an enlarged scale of a horizontal section through the housing in accordance with FIG. 1, with the one metal bar shown encircled by a dot-dash line in accordance with FIG. 1.

Metal bars 1 are sections of aluminum extruded profiles, and all have the same cross-section (see FIG. 2). Each metal bar 1 has a first longitudinal chamber 5 and a second longitudinal chamber 6. The covering parts 2 shown and the two hinged doors 3 each have a edge strip 7 that is inwardly-chamfered, that is, chamfered toward the housing interior, at a right-angle.

In metal bars 1, a side wall of the two longitudinal chambers 5 and 6, which have a nearly rectangular cross-section, is respectively formed by a clamping rib 8 and 9 (see FIG. 3 in particular) into which contact springs 4 are inserted. A narrow longitudinal slit 10 or 11 adjoins each clamping rib 8 or 9; these longitudinal slits 10 and 11 are both in the region of a longitudinal edge 12 of longitudinal chamber 5 or 6.

A longitudinal rib 13 that has an L-shaped cross-section is formed on metal bar 1 in the region of the second longitudinal chamber 6. The long L-leg of this rib is parallel to the longitudinal rib 9 of the second longitudinal chamber 6.

When covering parts 2 are mounted, or hinged doors 3 are closed, edge strips 7 of covering parts 2 or hinged doors 3 are parallel to the outer side 15 of the relevant clamping rib 8 or 9, and are at a slight distance with respect to this rib. These edge strips 7 are bare metal or are provided with an electrically conductive surface, for example with a metallic coating.

Figure 3:
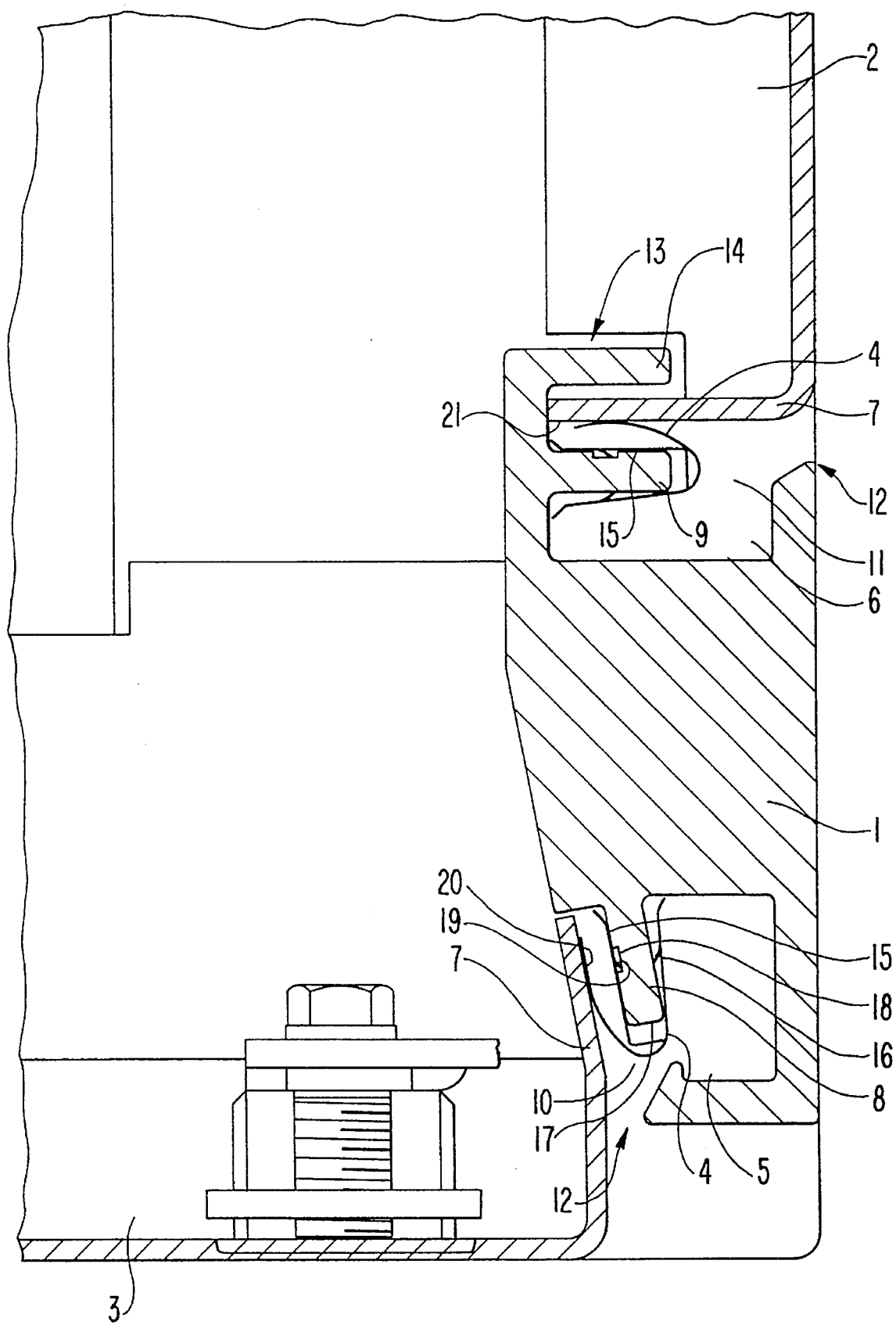
FIG. 3 shows an edge region from the horizontal section of FIG. 2 in accordance with the circular line, enlarged approximately three times.

Contact spring 4, which is made of a thin, corrosion-protected and electrically well-conducting, flexible material, has a U-shaped cross-section (FIG. 3). In the inserted position, one contact region of contact spring 4 rests in a contact-producing manner against the inside of clamping rib 8 and 9, which is oriented toward the relevant longitudinal chamber 5, 6. This contact region has a barb 16 produced by a stamping process and whose point is oriented toward the free longitudinal side 17 of clamping rib 8, 9.

On its outer side 15, clamping rib 8, 9 has a longitudinally-extending holding groove 18 that has a rectangular cross-section. When contact spring 4 is inserted, a flexible tab 19 of contact spring 4, which is formed from the resilient material by a stamping process, extends into this holding groove 18.

Each contact spring 4 has a stamped-out, concavely-curved spring tongue 20 that rests under spring pressure against the electrically conductive, outwardly-pointing side 21 of edge strips 7 when contact spring 4 is attached, covering parts 2 are mounted, and hinged doors 3 are closed.

Contact spring 4 comprises a series of identically configured, adjacently disposed and connected spring elements, each of which has at least one barb 16, one tab 19 and at least one spring tongue 20.

Edge strip 7 of the two hinged doors 3 is slightly inwardly chamfered at its free edge. Hinged doors 3 are attached to the housing with the aid of a pivot pin 22, and on their inside they have a lock 23 that is operated from the outside by means of a turning handle 24. A part of the sheet of the one hinged door 3 is additionally shown in a partly open position in FIG. 2.

It will be understood that the above description of the present invention is susceptible to various modifications, changes and adaptations, and the same are intended to be comprehended within the meaning and range of equivalents of the appended claims.

What is claimed is:

1. A housing for electronic devices, comprising:
 a base having a plurality of profiled metal bars extending in a longitudinal direction, each bar having at least one longitudinally-extending chamber formed therein, the at least one longitudinally-extending chamber having:
 a side wall formed by an inner side of a clamping rib, and
 a longitudinally-extending slit adjoining said clamping rib;
 at least one metal covering part secured to said base and having an inwardly-chamfered edge strip extending parallel to an outer side of said clamping rib; and
 at least one contact spring having a U-shaped cross-section, said at least one contact spring being inserted on the clamping rib of a respective metal bar, and being positioned between the respective metal bar and the at least one covering part.

2. A housing as defined in claim 1, wherein said contact spring has a contact region that rests in a contact-producing manner against the inner side of said clamping rib.

3. A housing as defined in claim 2, wherein the contact region has a barb with a point oriented toward a free longitudinal side of said clamping rib.

4. A housing as defined in claim 1, wherein said clamping rib has a longitudinally-extending holding groove on said outer side, said contact spring including a resilient tab extending into the longitudinally-extending holding groove.

5. A housing as defined in claim 1, wherein said contact spring has a spring tongue which rests against an outwardly-oriented side of said edge strip of said at least one covering part.

6. A housing as defined in claim 3, wherein said contact spring comprises a plurality of connected spring elements, each of which has a barb, a tab and a spring tongue.

7. A housing as defined in claim 1, wherein said at least one longitudinally-extending chamber has a substantially rectangular cross-section.

8. A housing as defined in claim 1, wherein said longitudinally-extending slit is located in a region of a longitudinal edge of a respective longitudinally-extending chamber.

9. A housing as defined in claim 1, wherein each of said metal bars includes a longitudinally-extending rib having an L-shaped cross-section whose long leg of the L-shaped cross-section is parallel to said clamping rib.

10. A housing as defined in claim 1, wherein said metal bars are sections of the same aluminum extruded profile.

* * * * *